(12) United States Patent
Ogawa et al.

(10) Patent No.: US 10,121,651 B2
(45) Date of Patent: Nov. 6, 2018

(54) METHOD OF MANUFACTURING SEMICONDUCTOR DEVICE

(71) Applicant: HITACHI KOKUSAI ELECTRIC INC., Tokyo (JP)

(72) Inventors: Arito Ogawa, Toyama (JP); Shin Hiyama, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/704,603

(22) Filed: Sep. 14, 2017

(65) Prior Publication Data

US 2018/0182619 A1 Jun. 28, 2018

(30) Foreign Application Priority Data

Dec. 28, 2016 (JP) .................................. 2016-255033

(51) Int. Cl.
| | |
|---|---|
| *H01L 21/02* | (2006.01) |
| *H01L 21/673* | (2006.01) |
| *C23C 16/50* | (2006.01) |
| *C23C 16/32* | (2006.01) |
| *C23C 16/34* | (2006.01) |
| *H01L 21/677* | (2006.01) |

(52) U.S. Cl.
CPC ...... *H01L 21/02167* (2013.01); *C23C 16/325* (2013.01); *C23C 16/345* (2013.01); *C23C 16/50* (2013.01); *H01L 21/0217* (2013.01); *H01L 21/67389* (2013.01); *H01L 21/67383* (2013.01); *H01L 21/67778* (2013.01)

(58) Field of Classification Search
CPC ......... H01L 21/02167; H01L 21/67389; H01L 21/0217; H01L 21/67778; H01L 21/67383; C23C 16/345; C23C 16/325; C23C 16/50

See application file for complete search history.

(56) References Cited

U.S. PATENT DOCUMENTS

| | | | |
|---|---|---|---|
| 2006/0121714 A1 | 6/2006 | Ohta et al. | |
| 2007/0167028 A1 | 7/2007 | Chou et al. | |
| 2013/0189841 A1* | 7/2013 | Balseanu | ........ H01L 21/823807 438/692 |
| 2015/0101755 A1 | 4/2015 | Hirose et al. | |

FOREIGN PATENT DOCUMENTS

| | | |
|---|---|---|
| JP | 2005-268699 A | 9/2005 |
| JP | 2006-165081 A | 6/2006 |
| JP | 2007-189173 A | 7/2007 |
| JP | 2011-238894 A | 11/2011 |

\* cited by examiner

*Primary Examiner* — Kyoung Lee
(74) *Attorney, Agent, or Firm* — Volpe and Koenig, P.C.

(57) ABSTRACT

A technique capable of forming a side wall of a gate electrode having high resistance-to-etching and low leakage current is provided. A method of manufacturing a semiconductor device according to the technique includes: (a) loading a substrate into a processing space in a process vessel, the substrate having thereon a gate electrode and an insulating film formed on a side surface of the gate electrode as a side wall; and (b) forming an etching-resistant film containing carbon and nitrogen on a surface of the insulating film by supplying a carbon-containing gas into the processing space.

11 Claims, 8 Drawing Sheets

METHOD OF MANUFACTURING SEMICONDUCTOR DEVICE

CROSS-REFERENCE TO RELATED PATENT APPLICATION

This U.S. non-provisional patent application claims priority under 35 U.S.C. § 119 of Japanese Patent Application No. 2016-255033, filed on Dec. 28, 2016, in the Japanese Patent Office, the entire contents of which are hereby incorporated by reference.

BACKGROUND

1. Field

The present disclosure relates to a method of manufacturing a semiconductor device.

2. Description of the Related Art

Recently, semiconductor devices are integrated at high density. As a result, the distance between electrodes or between wirings is reduced. Accordingly, the electrical capacitance between the electrodes or between the wirings increases.

Generally, the leakage current increases as the electrical capacitance increases. In view of the efficiency of the semiconductor device, the increase in the leakage current is not preferable. Therefore, for example, by forming sidewalls made of insulating material around the electrodes, leakage current is suppressed and the resistance to leakage current is improved.

The sidewall is formed by etching. When over-etching occurs, the sidewall becomes thinner and the leakage current increases. In order to overcome this problem, the resistance-to-etching may be improved by, for example, adding carbon to the side wall. However, since the dielectric constant increases by adding carbon, there is a problem that the leakage current increases again.

SUMMARY

Described herein is a technique capable of forming a side wall of a gate electrode having high resistance-to-etching and low leakage current.

According to one aspect of the technique described herein, there is provided a method of manufacturing a semiconductor device, including: (a) loading a substrate into a processing space in a process vessel, the substrate having thereon a gate electrode and an insulating film formed on a side surface of the gate electrode as a side wall; and (b) forming an etching-resistant film containing carbon and nitrogen on a surface of the insulating film by supplying a carbon-containing gas into the processing space.

DETAILED DESCRIPTION

First Embodiment

A first embodiment will be described below. First, a substrate 100 to be processed according to the first embodiment will be described with reference to FIG. 1. A gate electrode 101 is formed on the substrate 100. The gate electrode 101 includes a film such as titanium nitride (TiN) film and tungsten (W) film. An insulating film 102, which is later etched to be a side wall, is formed on surface of the gate electrode 101. The insulating film 102 may include a silicon nitride (SiN) layer.

The insulating film 102 is formed so as not to include a carbon component. For example, the insulating film 102 includes a silicon nitride layer free of carbon, which is also referred to as a carbon-free silicon nitride layer. Since the insulating film 102 is free of carbon, the insulating film 102 does not contribute to an increase in leakage current.

Figure 2:
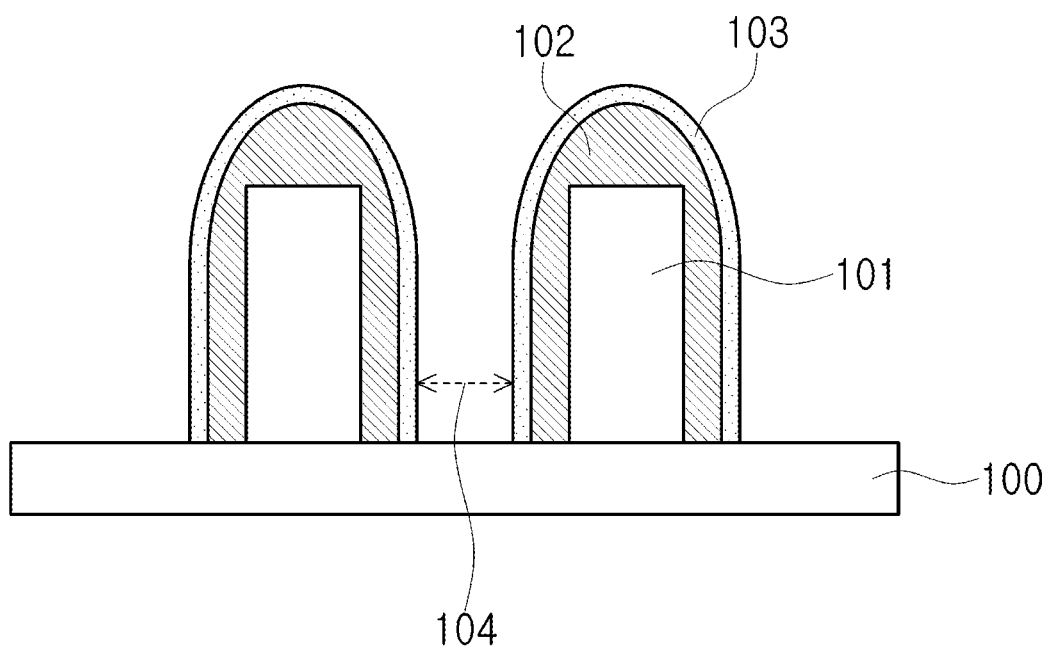
FIG. 2 schematically illustrates a cross-section of the substrate having thereon an etching-resistant film according to the embodiments.

Next, an etching-resistant film 103 according to the first embodiment will be described with reference to FIG. 2. In the carbon-containing gas supply step described later, the etching-resistant film 103 including a silicon carbonitride layer is formed on the surface of the insulating film 102 including the carbon-free silicon nitride layer. The etching-resistant film 103 constitutes a part of the sidewall after etching.

As described later, the etching-resistant film 103 containing carbon component has a high resistance-to-etching. Since the carbon component increases the leakage current, the etching-resistant film 103 is formed such that the etching-resistant film 103 is not in direct contact with the gate electrode 101. That is, the etching-resistant film 103 is formed so as to be in contact with the etching gas during etching but not with the gate electrode 101. Specifically, the etching-resistant film 103 is formed on the outer surface of the insulating film 102 formed on the surface of the gate electrode 101. The silicon carbonitride layer is also referred to as a carbon-doped silicon nitride layer.

Next, a substrate processing apparatus 200 used for forming the etching-resistant film 103 according to the first embodiment will be described with reference to FIGS. 3 and 4

<Substrate Processing Apparatus>

Figure 3:
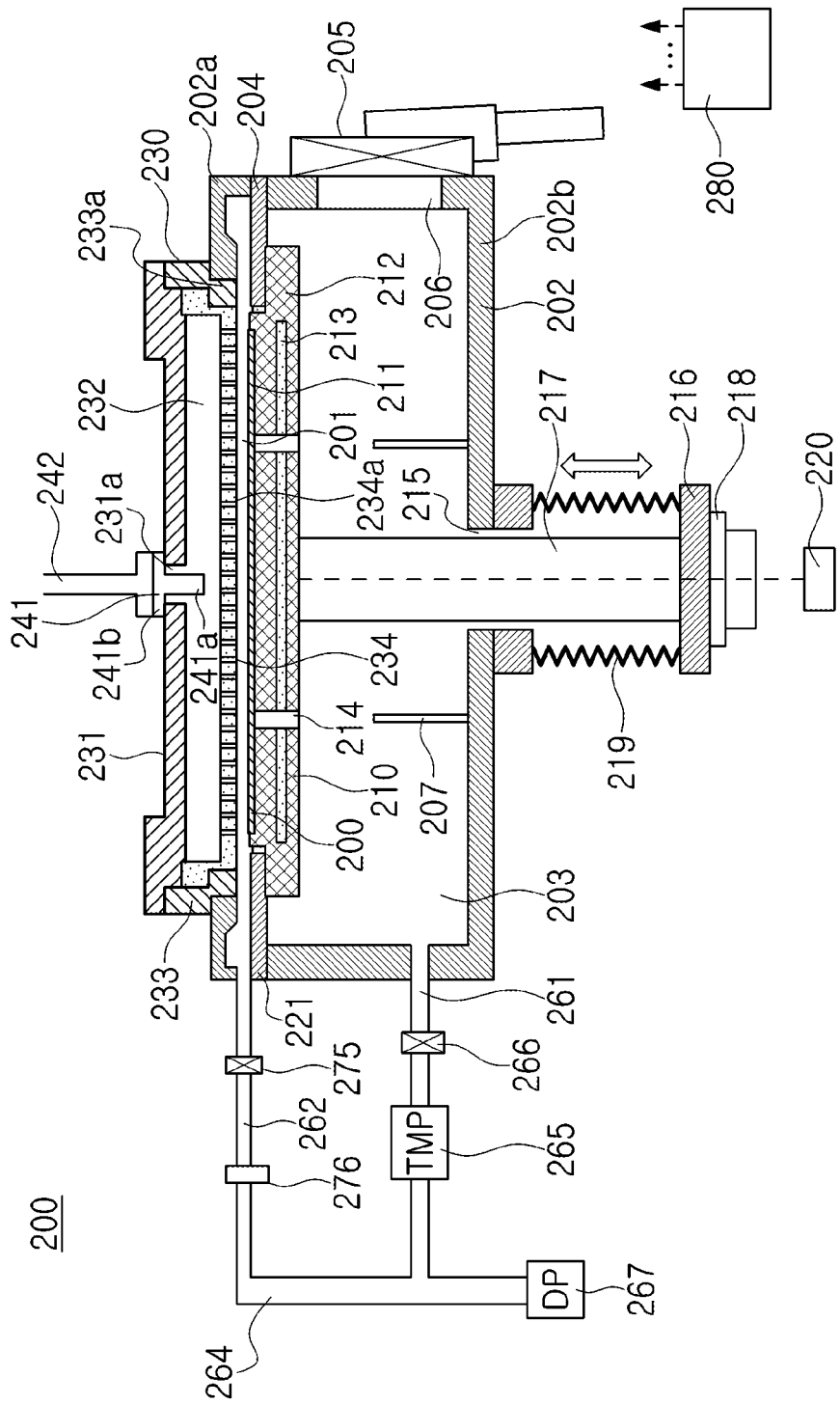
FIG. 3 schematically illustrates a substrate processing apparatus according to a first embodiment.
Figure 4:
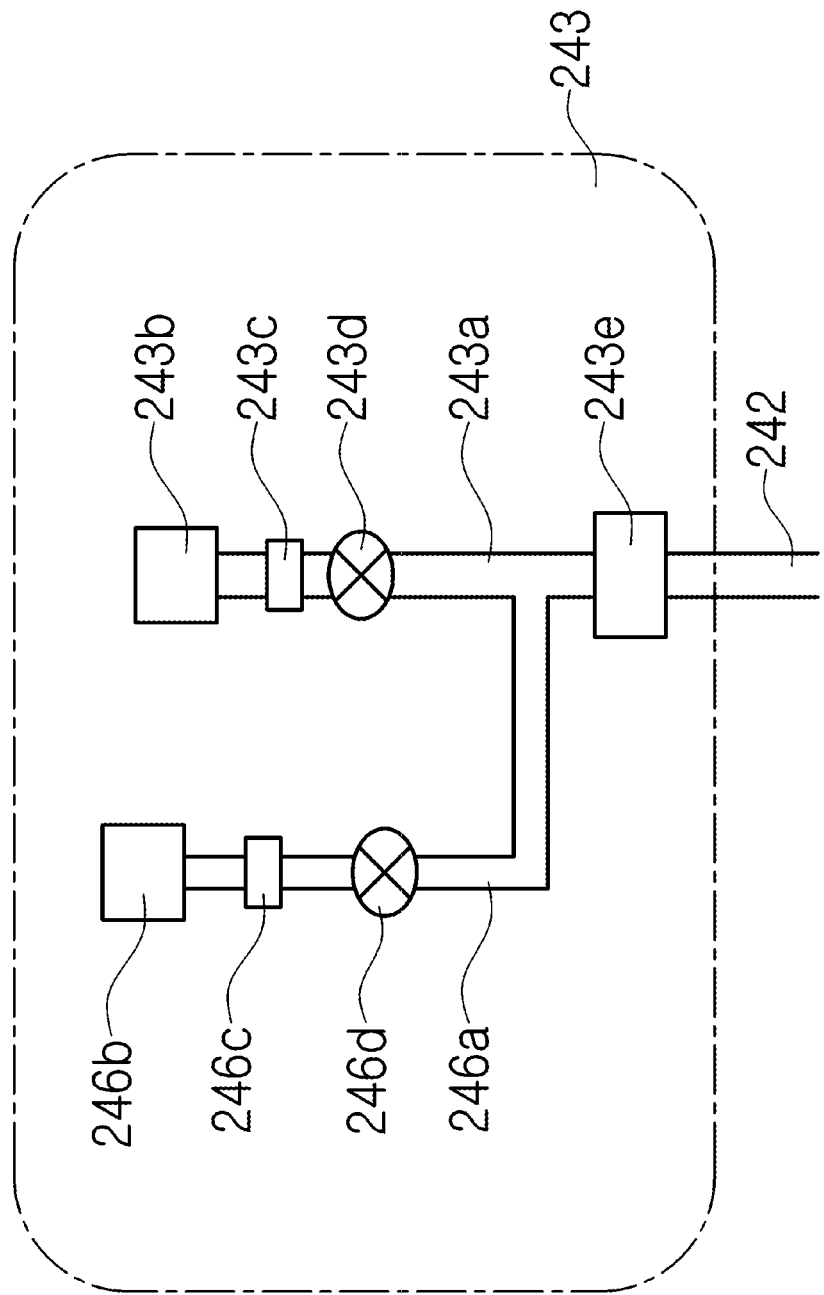
FIG. 4 schematically illustrates a gas supply system of the substrate processing apparatus according to the first embodiment.

As shown in FIG. 3, the substrate processing apparatus 200 includes a process vessel 202. For example, the process vessel 202 is a flat and sealed vessel having a circular horizontal cross-section. The process vessel 202 is made of a metal material such as aluminum (Al) and stainless steel (SUS). A processing space 201 where the substrate 100 such as a silicon wafer is processed and a transfer space 203 wherethrough the substrate 100 is transferred to the processing space 201. The process vessel 202 includes an upper vessel 202a and a lower vessel 202b. A partition plate 204 is provided between the upper vessel 202a and the lower vessel 202b.

A substrate loading/unloading port 206 is provided on a side surface of the lower vessel 202b adjacent to the gate valve 205. The substrate 100 is moved between a vacuum transfer chamber (not shown) and the transfer chamber 203 through a substrate loading/unloading port 1480. Lift pins 207 are provided at the bottom of the lower vessel 202b.

A substrate support unit 210 is provided in the processing space 201 to support the substrate 100. The substrate support unit 210 includes a substrate support 212 having a substrate placing surface 211 on which the substrate 100 is placed and a heater 213 serving as a heating source provided in the substrate support 212. Holes 214 wherethrough the lift pins 207 penetrate are provided in the substrate support 212 at positions corresponding to the lift pins 207. A heater control unit 220 is connected to the heater 213. The heater control unit 220 is configured to control the energization state of the heater 213.

The substrate support 212 is supported by a shaft 217. The shaft 217 penetrates the bottom of the process vessel 202 through a hole 215 provided at the bottom of the process vessel 202, and is connected to an elevating mechanism 218 at the outside of the process vessel 202. The substrate 100 placed on the substrate placing surface 211 may be elevated and lowered by elevating and lowering the shaft 217 and the substrate support 212 by the elevating mechanism 218. A bellows 219 covers the lower portion of the shaft 217 to maintain the insides of the process vessel 202 airtight.

When the substrate 100 is transported, the substrate support 212 is lowered until the substrate placing surface 211 of the substrate support 212 is at a height of the substrate loading/unloading port 206 (hereinafter referred to as "wafer transfer position"). When the substrate 100 is processed, the substrate support 212 is elevated until the substrate 100 reaches a processing position in the processing space 201 (hereinafter referred to as "wafer processing position").

A shower head 230, which is a gas dispersion mechanism, is provided in the upper portion (at the upstream side) of the processing space 201. A gas introduction hole 231a through which a first dispersion mechanism 241 is inserted is provided at a cover 231 of the shower head 230. The first dispersion mechanism 241 includes a front end portion 241a inserted into the shower head 230 and a flange 241b fixed to the cover 231. The front end portion 241a has a columnar shape, for example, a cylindrical shape. Dispersion holes (not shown) are provided on the side surface of the cylindrical front end portion 241a. The gas supplied by the gas supply unit (gas supply system) described later is supplied into a buffer space 232 via the front end portion 241a.

The shower head 230 includes a dispersion plate 234, which is a second dispersion mechanism for dispersing the gas. The upstream side of the dispersion plate 234 is the buffer space 232 and the downstream side of the dispersion plate 234 is the processing space 201. Through-holes 234a are provided in the dispersion plate 234. The dispersion plate 234 is disposed to face the substrate placing surface 211.

The upper vessel 202a includes a flange (not shown) and a support block 233 is placed on and fixed to the flange (not shown). The support block 233 includes a flange (not shown) and the dispersion plate 234 is placed on and fixed to the flange 233a.

<Gas Supply System>

The first dispersion mechanism 241 is connected to the gas introduction hole 231a provided in the cover 231 of the shower head 230. A common gas supply pipe 242 is connected to the first dispersion mechanism 241. The flange (not shown) is provided in the first dispersion mechanism 241. The flange provided in the first dispersion mechanism 241 is secured to the flange of the cover 231 or the common gas supply pipe 242 by a screw-like fastener.

The first dispersion mechanism 241 and the common gas supply pipe 242 spatially communicate with each other within the tubes. The gas supplied through the common gas supply pipe 242 is supplied into the shower head 230 through the first dispersion mechanism 241 and the gas introduction hole 231a. A first gas supply pipe 243a is connected to the common gas supply pipe 242.

<First Gas Supply System>

A first gas supply source 243b, a mass flow controller 243c (MFC) which is a flow rate controller and a valve 243d which is an on/off valve are provided at the first gas supply pipe 243a in order from the upstream side to the downstream side of the first gas supply pipe 243a. A plasma generation unit 243e may be provided at the first gas supply pipe 243a.

A gas containing a first element (hereinafter also referred to as "a first element-containing gas") is supplied to the shower head 230 via the mass flow controller 243c and the valve 243d provided in the first gas supply pipe 243a and the common gas supply pipe 242.

The first element-containing gas is a modifying gas, that is, one of process gases. In the first embodiment, the first element-containing gas may include a carbon-containing gas. Specifically, the carbon-containing gas may include a gas such as propylene ($C_3H_6$) gas and ethylene ($C_2H_4$) gas.

The downstream end of a first inert gas supply pipe 246a is connected to the first gas supply pipe 243a at the downstream side of the valve 243d. An inert gas supply source 246b, a mass flow controller 246c (MFC) which is a flow rate controller and a valve 246d are provided at the first inert gas supply pipe 246a in order from the upstream side to the downstream side of the first inert gas supply pipe 246a. An inert gas acts as a carrier gas or a dilution gas.

In the first embodiment, the inert gas includes, for example, nitrogen ($N_2$) gas. Instead of $N_2$ gas, rare gases such as helium (He) gas, neon (Ne) gas and argon (Ar) gas may be used as the inert gas.

The first gas supply system 243 may include the first gas supply pipe 243a, the mass flow controller 243c and the valve 243d. The first gas supply system 243 may also be referred to as the first gas supply unit.

The first inert gas supply pipe 246a, the mass flow controller 246c and the valve 246d constitutes a first inert gas supply system. The first inert gas supply system may further include the inert gas supply source 246b and the first gas supply pipe 243a.

The first gas supply system 243 may further include the first gas supply source 243b and the first inert gas supply system.

<Exhaust System>

An exhaust system for exhausting the atmosphere of the process vessel 202 may include a plurality of exhaust pipes connected to the process vessel 202. Specifically, the exhaust system includes an exhaust pipe 262 connected to the processing space 201 and an exhaust pipe 261 connected to the transfer space 203. The exhaust pipe 264 is connected to the exhaust pipes 261 and 262 at the downstream sides of the exhaust pipes 261 and 262.

The exhaust pipe 261 is connected to a side surface of the transfer space 203. A turbo molecular pump 265 (TMP) and a valve 266 are provided at the exhaust pipe 261. An atmosphere of the transfer space is controlled by the co-operation of the turbo molecular pump 265 and the valve 266.

The exhaust pipe 262 is connected to a side surface of the processing space 201. An APC (Automatic Pressure Controller) 276, which is a pressure controller for adjusting the inner pressure of the processing space 201 to a predetermined pressure, is provided at the exhaust pipe 262. The APC 276 adjusts the conductance of the exhaust pipe 262 in accordance with an instruction from the controller 280, which will be described later. A valve 275 is provided at exhaust pipe 262 at the upstream side of the APC 276. The exhaust pipe 262, the valve 275 and the APC 276 are collectively referred to as a processing space exhaust unit.

A dry pump 267 (DP) is provided at the exhaust pipe 264. As shown in FIG. 3 the exhaust pipe 262 and the exhaust pipe 261 are connected to the exhaust pipe 264 in order from the upstream side to the downstream side of the exhaust pipe 264. The DP 267 is provided at the exhaust pipe 264 at the downstream side of the portions to which the exhaust pipe 262 and the exhaust pipe 261 are connected. The DP 267 exhausts the atmosphere of the processing space 201 and the transfer space 203 through the exhaust pipe 262 and the exhaust pipe 261, respectively.

<Controller>

Next, a controller 280 will be described with reference to FIG. 5. The substrate processing apparatus 200 includes the controller 280 configured to control components thereof.

Figure 5:
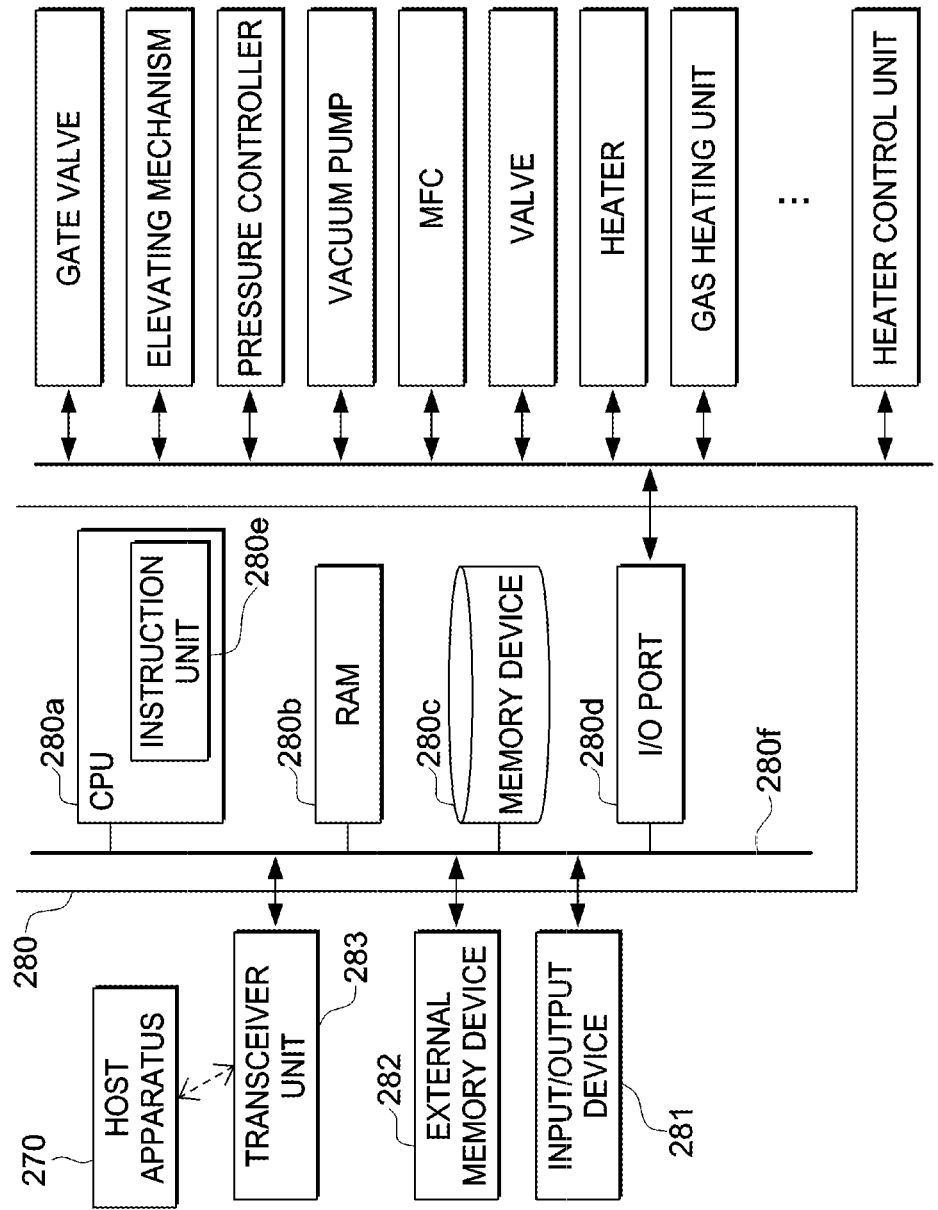
FIG. 5 schematically illustrates a controller of the substrate processing apparatus according to the first embodiment.

FIG. 5 schematically illustrates the configuration of the controller 280. The controller 280, which is the control unit, may be embodied by a computer having a CPU (Central Processing Unit) 280a, a RAM (Random Access Memory) 280b, a memory device 280c and an I/O port 280d. The RAM 280b, the memory device 280c and the I/O port 280d may exchange data with the CPU 280a via an internal bus 280f. The CPU 280a may include an instruction unit 280e which is configured to instruct the components of the substrate processing apparatus 200 to transmit and receive the information among the components.

An input/output device 281 such as a touch panel and an external memory device 282 may be connected to the controller 280. Also, a transceiver unit 283 electrically connected to a host apparatus 270 through a network is provided.

The memory device 280c may be embodied by components such as flash memory and HDD (Hard Disk Drive). A control program for controlling the operation of the substrate processing apparatus and a process recipe in which information such as the order and condition of the substrate processing is stored are readably stored in the memory device 280c. The process recipe is a program that is executed in the controller 280 to obtain a predetermined result by performing sequences of the substrate processing. Hereinafter, the process recipe and the control program are collectively referred to simply as a program. The term "program" may refer to only the process recipe, only the control program, or both. The RAM 280b is a work area in which the program or the data read by the CPU 280a are temporarily stored.

The I/O port 280d is connected to the components such as the gate valve 205, the elevating mechanism 218 and the heater 213.

The CPU 280a is configured to read and execute the control program stored in the memory device 280c, and read the process recipe in accordance with an instruction such as an operation command inputted from the input/output device 281. The CPU 280a may be configured to perform operations such as opening and closing operations of the gate valve 205, elevating and lowering operations of the elevating mechanism 218, ON/OFF operations of the pumps 265 and 267, flow rate adjusting operations of the MFCs 243c and 246c, and operations of the valves. A plurality of recipes for processing substrates is stored as a process recipe. The plurality of recipes read when an instruction for processing the substrate is received from the host apparatus 270.

The controller 280 of the first embodiment may be embodied by preparing the external memory device 282 (e.g. magnetic disks such as hard disk, optical disks such as DVD, magneto-optical disks such as MO, and semiconductor memories such as USB memory) and installing the program on the general purpose computer using the external memory device 282. The method of providing the program to the computer is not limited to the external memory device 282. The program may be directly provided to the computer using a communication means such as a network (Internet or dedicated line) without the external memory device 282. The memory device 280c or the external memory device 282 may be embodied by a computer-readable recording medium. Hereinafter, the memory device 280c or the external memory device 282 may be collectively referred to as recording medium. Hereinafter, the term "recording medium" may refer to only the memory device 280c, only the external memory device 282, or both.

<Substrate Processing>

Figure 1:
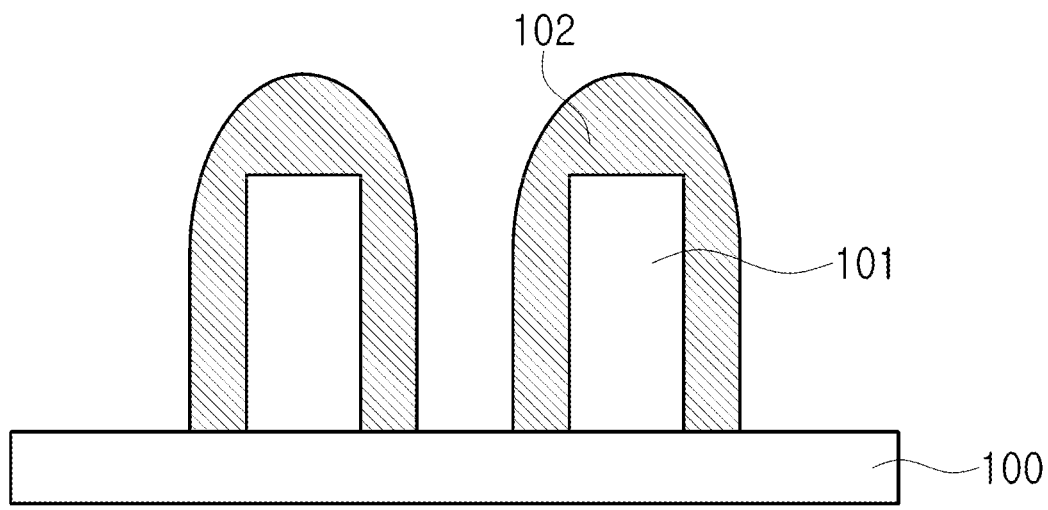
FIG. 1 schematically illustrates a cross-section of a substrate having thereon a gate electrode and an insulating film according to an embodiment.
Figure 6:
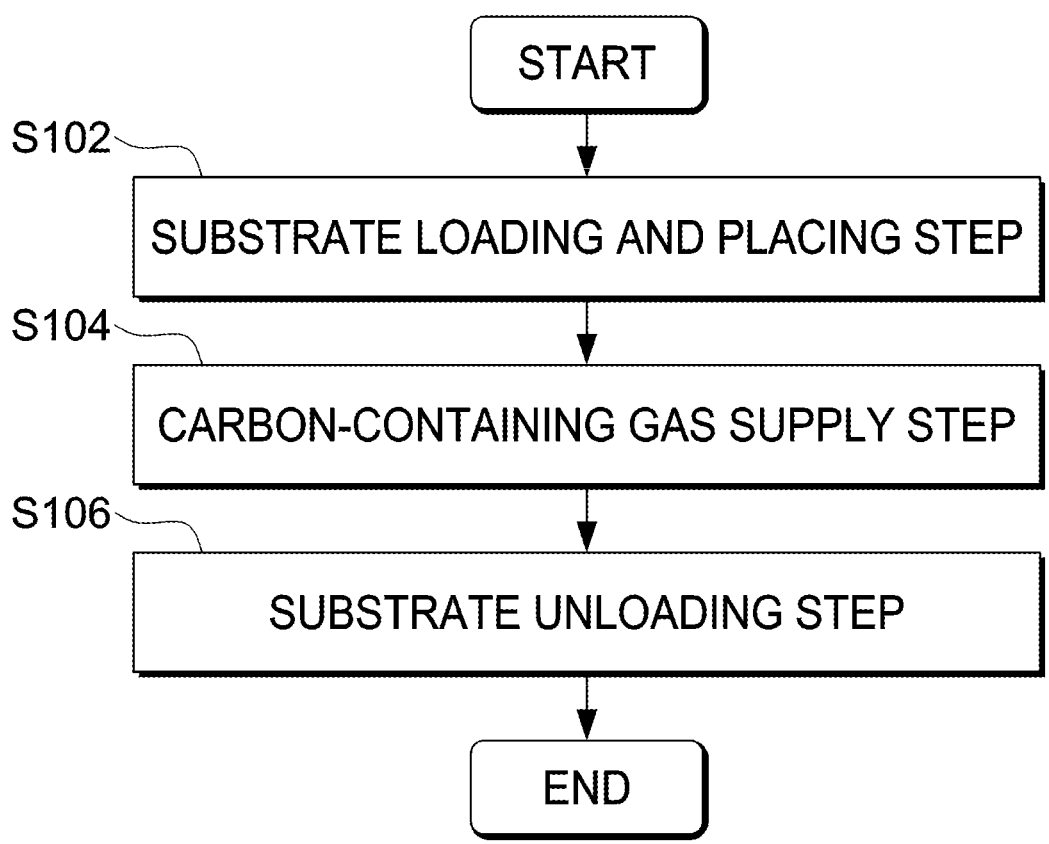
FIG. 6 schematically illustrates a flow of a substrate processing according to the first embodiment.

Hereinafter, a method of forming the etching-resistant film 103 on the insulating film 102 of the substrate 100 transferred into the substrate processing apparatus 200 will be described with reference to FIG. 6. The substrate 100 transferred into the substrate processing apparatus 200 is shown in FIG. 1.

An example of forming etching-resistant film 103 using propylene gas as the carbon-containing gas will be described.

<Substrate Loading and Placing Step S102>

The substrate support 212 of the substrate processing apparatus 200 is lowered to the position for transferring the substrate 100 (the wafer transfer position). Next, by opening the gate valve 205, the transfer space 203 is in communication with the transfer chamber (not shown). The substrate 100 is transferred from the transfer chamber (not shown) into the transfer space 203 using a wafer transfer device (not shown). The substrate 100 is placed onto the lift pins 207 using the wafer transfer device (not shown).

After the substrate 100 is transferred into the process vessel 202, the wafer transfer device is retracted to the outside of the process vessel 202, and the gate valve 205 is closed to seal the process vessel 202. Thereafter, the substrate support 212 is elevated until the substrate 100 reaches to the position for processing the substrate 100 (the wafer processing position) in the processing space 201 described above.

After the substrate 100 is loaded into the transfer space 203 and elevated to the wafer processing position in the processing space 201, the valve 266 is closed. The transfer space 203 is thereby isolated from the TMP 265, and the exhaust of the transfer space 203 by the TMP 265 is terminated. By opening the valve 275, the processing space 201 is in communication with the APC 276. The APC 276 controls the exhaust flow rate of the processing space 201 by the DP 267 by adjusting the conductance of the exhaust pipe 262. The inner pressure of the processing space 201 is thereby maintained at a predetermined pressure (for example, a high vacuum ranging from $10^{-5}$ Pa to $10^{-1}$ Pa).

When the substrate 100 is placed on the substrate support 212, the heater 213 embedded in the substrate support 212 is turned on. The heater 213 is controlled to adjust the temperature of the surface of the substrate 100 to a predetermined temperature. The temperature of the substrate 100 may range, for example, from room temperature to 800° C., preferably from room temperature to 700° C. The temperature of the heater 213 is adjusted by controlling the energization state of the heater 213 by the heater control unit 220 based on a control value. The control value is calculated by the controller 280 based on the temperature detected by a temperature sensor (not shown).

<Carbon-Containing Gas Supply Step S104>

Next, a carbon-containing gas supply step S104 is performed. In the carbon-containing gas supply step S104, propylene gas as the carbon-containing gas is supplied to the processing space 201 by the first gas supply system. Since the propylene gas is supplied into the processing space 201 through the plasma generation unit 243e, the propylene gas in plasma state is supplied onto the substrate 100.

When propylene is activated to plasma state, the hydrogen component and the carbon component of propylene are separated. The carbon component is supplied to the surface of the silicon nitride layer, i.e., the insulating film 102, to bond with the nitrogen and silicon at the surface. As a result, the etching-resistant film 103, which is a silicon carbonitride layer, is formed as shown in FIG. 2.

Since the etching-resistant film 103 contains carbon, the resistance-to-etching of the etching-resistant film 103 is improved. That is, the resistance-to-etching of the etching-resistant film 103 is higher than that of the silicon nitride layer 102 in which the carbon component is not present or the content ratio of the carbon component is low.

In the carbon-containing gas supply step S104, the inner pressure of the processing space 201 may range from 100 Pa to 1000 Pa, the temperature of the substrate 100 may range from 150° C. to 400° C., and the flow rate of the supplied carbon-containing gas may range from 1000 sccm to 3000 sccm. After a predetermined time elapses and a silicon carbonitride layer having a desired thickness is formed on the substrate 100, the supply of the carbon-containing gas is stopped.

Preferably, the insulating film 102 has a thickness of at least 3 nm to 4 nm. The thickness of the insulating film 102 is such that leakage current does not occur according to the quantum mechanics. The etching-resistant film 103 is thinner than the insulating film 102. When the etching-resistant film 103 is thinner than the insulating film 102, a distance 104 between adjacent insulating films 102 may be secured even when the distance between the adjacent gate electrodes 101 is reduced.

<Substrate Unloading Step S106>

When the carbon-containing gas supply step S104 is completed, the substrate unloading step S106 is performed. In the substrate unloading step S106, the processed substrate 100 is unloaded from the process vessel 202 in an order reverse to the order in the substrate loading and placing Step S102 step S202.

According to the first embodiment, by forming the etching-resistant film 103 on the outer surface of the insulating film 102, the leakage current may be suppressed.

Second Embodiment

Figure 7:
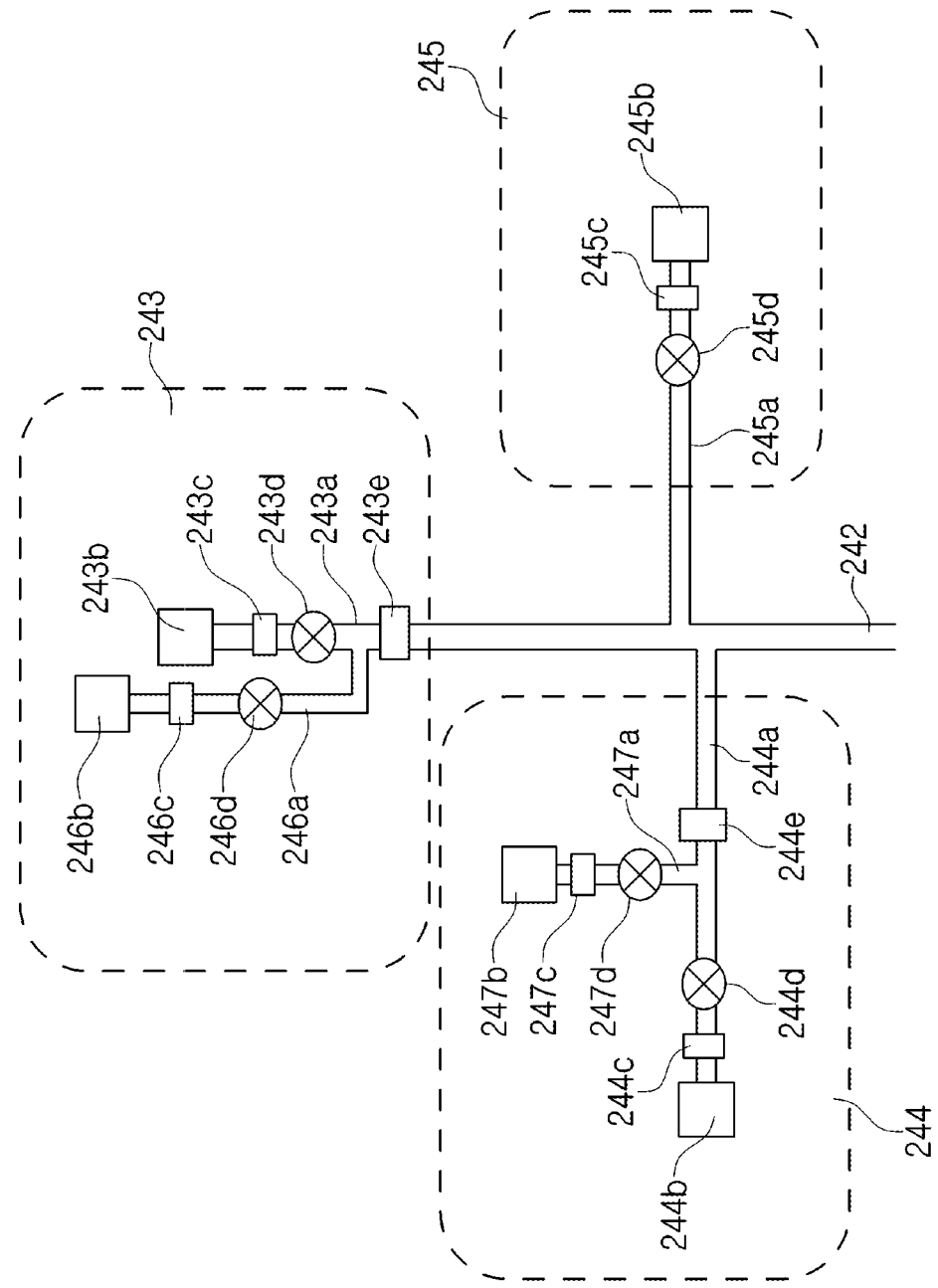
FIG. 7 schematically illustrates a gas supply system of a substrate processing apparatus according to a second embodiment described herein.
Figure 8:
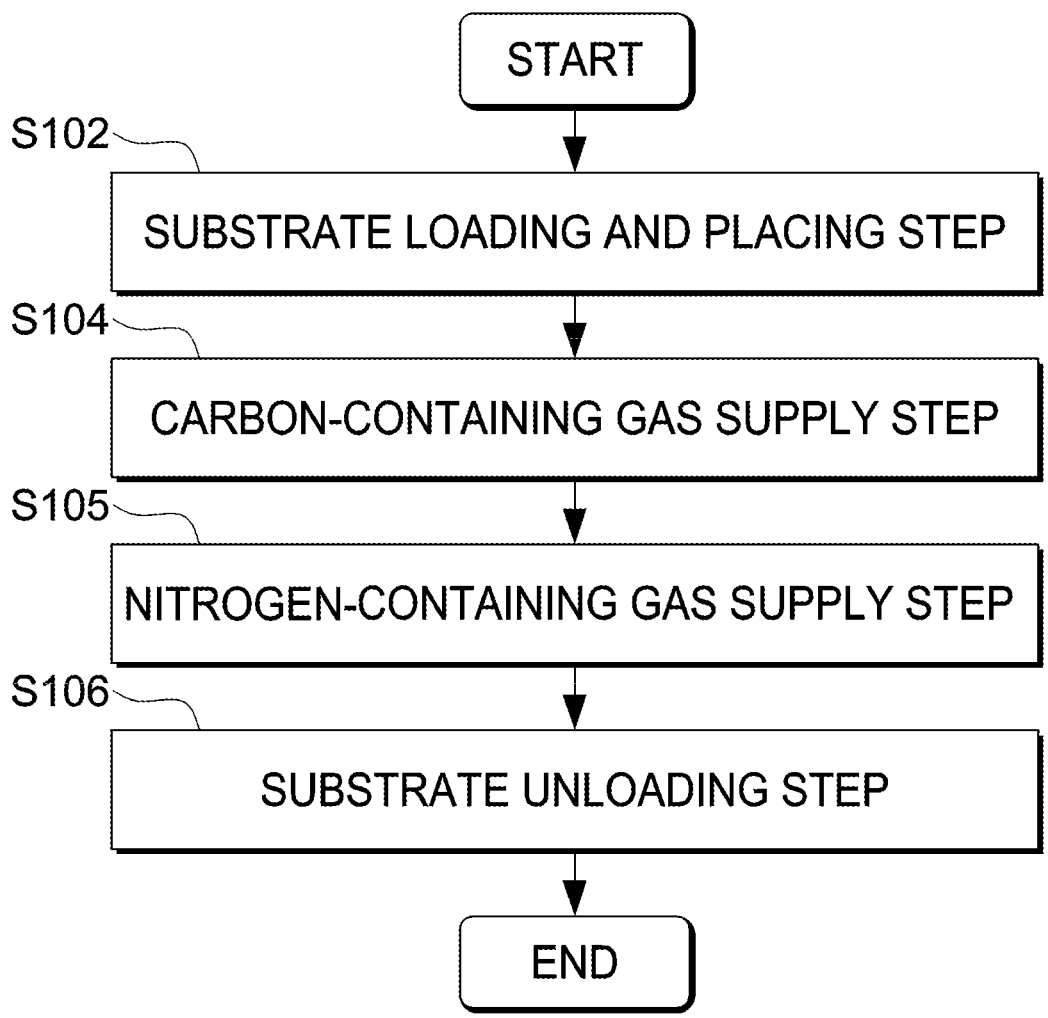
FIG. 8 schematically illustrates a flow of a substrate processing according to the second embodiment described herein.

Next, a second embodiment will be described with reference to FIGS. 7 and 8. FIG. 7 schematically illustrates a gas supply system of a substrate processing apparatus according to the second embodiment, and FIG. 8 schematically illustrates a flow of a substrate processing according to the second embodiment. The configuration of the second embodiment differs from that of the first embodiment in that the substrate processing apparatus according to the second embodiment further includes a second gas supply system and a third gas supply system and the substrate processing according to the second embodiment further includes a nitrogen-containing gas supply step.

Hereinafter, the second embodiment will be described in detail. The configuration of the second embodiment the same as that of the first embodiment is omitted.

<Second Gas Supply System>

A second gas supply system 244 may also be referred to as a second gas supply unit. A second gas supply source 244b, a mass flow controller 244c (MFC) which is a flow rate controller and a valve 244d which is an on/off valve are provided at a second gas supply pipe 244a in order from the upstream side to the downstream side of the second gas supply pipe 244a.

A gas containing a second element (hereinafter also referred to as "a second element-containing gas") is supplied to the shower head 230 via the mass flow controller 244c and the valve 244d provided in the second gas supply pipe 244a and the common gas supply pipe 242.

The second element-containing gas is one of the process gases. In the second embodiment, the second element-containing gas removes impurities contained in the etching-resistant film 103 formed in the carbon-containing gas supply step S104. The second element-containing gas contains the second element different from the first element. The second element-containing gas may include a nitrogen-containing gas. For example, ammonia ($NH_3$) gas may be used as the nitrogen-containing gas.

The second gas supply system 244 may include the second gas supply pipe 244a, the mass flow controller 244c and the valve 244d.

The downstream end of a second inert gas supply pipe 247a is connected to the second gas supply pipe 244a at the downstream side of the valve 244d. An inert gas supply source 247b, a mass flow controller 247c (MFC) which is a flow rate controller and a valve 247d are provided at the second inert gas supply pipe 247a in order from the upstream side to the downstream side of the second inert gas supply pipe 247a.

An inert gas is supplied to the shower head 230 via the mass flow controller 247c and the valve 247d provided in the second inert gas supply pipe 247a and second gas supply pipe 244a. The inert gas acts as a carrier gas or a dilution gas.

The second inert gas supply pipe 247a, the mass flow controller 247c and the valve 247d constitutes a second inert gas supply system. The second inert gas supply system may further include the inert gas supply source 247b.

The second gas supply system 244 may further include the second gas supply source 247b and the second inert gas supply system.

<Third Gas Supply System>

A third gas supply system 244 may also be referred to as a third gas supply unit. A third gas supply source 245b, a mass flow controller 245c (MFC) which is a flow rate controller and a valve 245d which is an on/off valve are provided at a third gas supply pipe 245a in order from the upstream side to the downstream side of the third gas supply pipe 245a.

An inert gas serving as a purge gas is supplied to the shower head 230 via the mass flow controller 245c and the valve 245d provided in the third gas supply pipe 245a and the common gas supply pipe 242.

The inert gas supplied from the third gas supply source 245b acts as the purge gas for purging the gas in the process vessel 202 or the showerhead 230 in the substrate processing.

The third gas supply system 245 may include the third gas supply pipe 245a, the mass flow controller 245c and the valve 245d. The third gas supply system 245 may further include the third gas supply source 245b.

<Nitrogen-Containing Gas Supply Step S105>

Next, a nitrogen-containing gas supply step S105 will be described with reference to FIG. 8. The nitrogen-containing gas supply step S105 is performed after the carbon-containing gas supply step S104 of the first embodiment.

After the carbon-containing gas supply step S104, the inert gas is supplied to the processing space 201 by the third gas supply system 245 to exhaust the atmosphere of the carbon-containing gas in the processing space 201.

After exhausting the atmosphere of the carbon-containing gas, ammonia gas is supplied to the processing space 201 by the second gas supply system 244. For example, after the ammonia gas is activated into plasma state by a remote plasma unit 244e, the ammonia gas divided into hydrogen component and nitrogen component is supplied the processing space 201.

The reason for performing the nitrogen-containing gas supply step S105 after performing the carbon-containing gas supply step S104 in a second embodiment will be explained hereinafter. An oxygen component may be separated from components such as the substrate support 212 and side walls defining the processing space 201 made of quartz due to a plasma attack. The purge gas may also contain an oxygen component. When the oxygen component is present in the processing space 201, the surface of the etching-resistant film 103, which is a silicon carbonitride film, reacts with the oxygen component, and a silicon oxycarbonitride layer including an oxygen component is formed on the surface of the etching-resistant film 103. The oxygen component serves as an impurity to the etching-resistant film 103. Therefore, the silicon oxycarbonitride layer may degrade the resistance-to-etching of the etching-resistant film 103.

Thus, according to the second embodiment, the oxygen component is replaced with the nitrogen component of the nitrogen-containing gas by reacting the nitrogen-containing gas with the silicon oxycarbonitride layer. Specifically, the oxygen component reacts with the nitrogen component to generate NO gas, and nitrogen bonds to a site from which oxygen is separated. Thus, the resistance-to-etching is improved while increasing the nitrogen concentration at the surface of the etching-resistant film 103.

Third Embodiment

Figure 9:
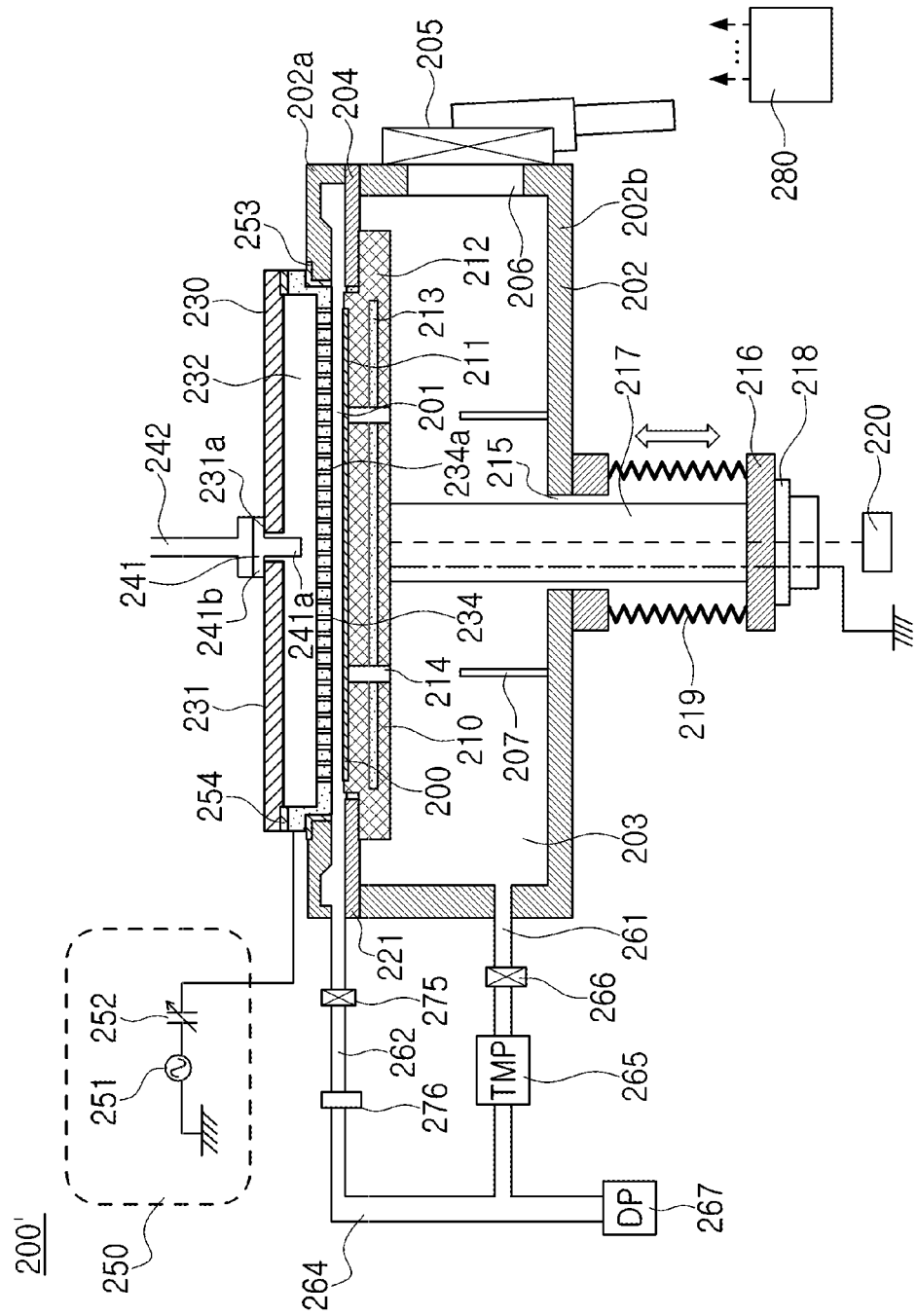
FIG. 9 schematically illustrates a substrate processing apparatus according to a third embodiment described herein.

Next, a third embodiment will be described with reference to FIG. 9. The configuration of the third embodiment differs from that of the first embodiment in that a substrate processing apparatus 200' of the third embodiment further includes a structure capable of generating plasma directly in the processing space 201. Specifically, the substrate processing apparatus 200' shown in FIG. 9 further includes a plasma generation unit 250. According to the third embodiment, the substrate support 212 of the substrate processing apparatus 200' is electrically grounded.

The plasma generation unit 250 may include a matching unit 251 and a power supply 252. One electrode of the power supply 251 is connected to the matching unit 252, and the other electrode of the power supply 251 is electrically grounded. That is, the power supply 251 is electrically connected to the dispersion plate 234 via a matching unit 252. The dispersion plate 234 is disposed adjacent to the upper vessel 202a with an insulating member 253 therebetween and adjacent to the cover 231 with an insulating member 254 therebetween. That is, the dispersion plate 234 is electrically insulated from the cover 231 and the upper vessel 202a.

In order to generate plasma in the processing space 201, electrical power is supplied from the power supply 251 and the gas supplied in the processing space 201 is activated into plasma state.

For example, carbon-containing gas supplied in a carbon-containing gas supply step S104 may be excited into plasma state. The etching-resistant film 103 having a high concentration of carbon may be formed on the insulating film 102 by generating high-energy plasma above the substrate 100.

As is generally known, carbon-containing gases such as propylene are likely to adhere to quartz. Thus, when the distance between the plasma generating unit 250 and the substrate 100 is long, the carbon-containing gas such as propylene is likely to be attached to quartz components during the supply into the processing space 201. As a result, the amount of the carbon-containing gas reaching the substrate 100 is reduced. That is, the supply efficiency of the carbon-containing gas is degraded.

In contrast, when plasma is generated in the vicinity of the substrate 100, that is, in the processing space 201 as in the third embodiment, the amount of the carbon-containing gas such as propylene reaching the substrate 100 may be suppressed from being reduced. That is, the supply efficiency of the carbon-containing gas may be improved.

While the third embodiment is described by way of an example wherein propylene gas is used as the carbon-containing gas, the above-described technique is not limited thereto. For example, the above-described technique may be applied when acetylene ($C_2H_2$) gas or ethylene ($C_2H_4$) gas is used as the carbon-containing gas.

MAIN EFFECTS

The main effects of the above-described embodiments are as follows.

(a) Since the silicon carbonitride layer is formed on the surface of silicon nitride layer adjacent to the gate electrode, the resistance-to-etching may be improved while suppressing an increase in leakage current.

(b) Since the silicon carbonitride layer is subjected to additional nitridation process, the nitrogen concentration in the silicon carbonitride layer is further increased, thereby improving the resistance-to-etching.

According to the technique described herein, the side wall of a gate electrode having high resistance-to-etching and low leakage current is provided.

What is claimed is:

1. A method of manufacturing a semiconductor device, comprising:
   (a) loading a substrate into a processing space in a process vessel, the substrate having thereon a gate electrode and an insulating film formed on a side surface of the gate electrode as a side wall;

(b) forming an etching-resistant film containing carbon and nitrogen on a surface of the insulating film by supplying a carbon-containing gas into the processing space; and (c) supplying a nitrogen-containing gas into the processing space after performing (b).

2. The method of claim 1, wherein a carbon content ratio of the etching-resistant film is higher than that of the insulating film.

3. The method of claim 2, wherein (b) comprises:

(b-1) activating the carbon-containing gas into plasma state; and (b-2) supplying a carbon component of the carbon-containing gas in plasma state to the surface of the insulating film.

4. The method of claim 3, wherein the carbon-containing gas is activated into plasma state in the processing space.

5. The method of claim 3, wherein the etching-resistant film formed in (b) is thinner than the insulating film.

6. The method of claim 2, wherein the etching-resistant film formed in (b) is thinner than the insulating film.

7. The method of claim 1, wherein (b) comprises:

(b-1) activating the carbon-containing gas into plasma state; and (b-2) supplying a carbon component of the carbon-containing gas in plasma state to the surface of the insulating film.

8. The method of claim 7, wherein the carbon-containing gas is activated into plasma state in the processing space.

9. The method of claim 8, wherein the etching-resistant film formed in (b) is thinner than the insulating film.

10. The method of claim 7, wherein the etching-resistant film formed in (b) is thinner than the insulating film.

11. The method of claim 1, wherein the etching-resistant film formed in (b) is thinner than the insulating film.

* * * * *